(12) United States Patent
Kazuyuki et al.

(10) Patent No.: US 8,340,811 B2
(45) Date of Patent: Dec. 25, 2012

(54) SUBSTRATE SUPPORTING APPARATUS, SUBSTRATE PROCESSING APPARATUS, SUBSTRATE SUPPORTING METHOD, CONTROL PROGRAM OF SUBSTRATE SUPPORTING APPARATUS, AND RECORDING MEDIUM

(75) Inventors: Majima Kazuyuki, Kawasaki (JP); Goshokubo Gen, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 444 days.

(21) Appl. No.: 12/714,797

(22) Filed: Mar. 1, 2010

(65) Prior Publication Data
US 2010/0222919 A1 Sep. 2, 2010

(30) Foreign Application Priority Data

Mar. 2, 2009 (JP) ................... 2009-047612
Mar. 2, 2009 (JP) ................... 2009-047613
Jan. 18, 2010 (JP) ................... 2010-007700

(51) Int. Cl.
*B29C 39/00* (2006.01)
*G06F 19/00* (2006.01)
*G06F 17/00* (2006.01)
*B65H 1/00* (2006.01)

(52) U.S. Cl. ........ 700/214; 700/228; 700/192; 700/114; 700/243; 700/245

(58) Field of Classification Search .................. None
See application file for complete search history.

(56) References Cited

U.S. PATENT DOCUMENTS

| 6,184,972 B1 * | 2/2001 | Mizutani et al. ................. 355/72 |
| 2009/0151480 A1 * | 6/2009 | Sakurai et al. ................. 73/865.8 |
| 2009/0196149 A1 * | 8/2009 | Atarashi et al. ........... 369/112.23 |

FOREIGN PATENT DOCUMENTS
JP 7-015773 1/1995

* cited by examiner

*Primary Examiner* — Gene Crawford
*Assistant Examiner* — Yolanda Jones
(74) *Attorney, Agent, or Firm* — Fitzpatrick, Cella, Harper & Scinto (57) ABSTRACT

A substrate supporting apparatus includes a pallet on which a substrate is mounted, a pallet double-end holding mechanism holding both ends of the pallet in a diameter direction while the pallet is in a vertical posture, a pallet center holding mechanism rotatably holding a center section of the pallet, and a moving mechanism moving an apparatus body, wherein the pallet double-end holding mechanism is a mechanism that grips both ends of the pallet in the diameter direction from both sides of a thickness direction, the pallet double-end holding mechanism holds the pallet during movement, the pallet is held by both of the holding mechanisms during delivery from the pallet double-end holding mechanism to the pallet center holding mechanism, and the pallet center holding mechanism rotatably holds the center section of the pallet and holding by the pallet double-end holding mechanism is released during substrate processing.

19 Claims, 9 Drawing Sheets

SUBSTRATE SUPPORTING APPARATUS, SUBSTRATE PROCESSING APPARATUS, SUBSTRATE SUPPORTING METHOD, CONTROL PROGRAM OF SUBSTRATE SUPPORTING APPARATUS, AND RECORDING MEDIUM

BACKGROUND OF THE INVENTION

1. Field of the Invention

The present invention relates to a substrate supporting apparatus that moves between vacuum chambers while supporting a substrate, an inline-type substrate processing apparatus that hermetically connects a plurality of vacuum chambers, a substrate supporting method, a control program of the substrate supporting apparatus, and a recording medium.

2. Description of the Related Art

In an inline-type substrate processing apparatus, a plurality of vacuum chambers including process chambers that form a thin film is hermetically connected. The inline-type substrate processing apparatus includes a substrate supporting apparatus (carrier) that moves between vacuum chambers while supporting a substrate so that vacuum film formation processing is continuously performed on the substrate. From the viewpoint of improving productivity, the substrate supporting apparatus is provided with a disc-like pallet that is rotatable by being mounted with a plurality of substrates and is configured to be able to form a thin film from both sides of the substrate at the same time while holding the pallet in a vertical posture.

As a related technology, a substrate supporting apparatus that is provided with a pallet capable of being mounted with one or more substrates and rotatably supports a center section of the pallet by a rotation supporting mechanism fixed onto a carrier capable of performing a translation via a support medium is proposed (see Japanese Patent Application Laid-Open No. 07-15773 (FIG. 1)). The substrate supporting apparatus is provided with the rotation supporting mechanism in the center section of a second support medium hooked to a first support medium fixed to the carrier and has a structure in which the pallet and the substrate supporting apparatus are not separable.

However, according to the technology of Japanese Patent Application Laid-Open No. 07-15773, the pallet and the substrate supporting apparatus are structured integrally so that it is necessary to mount a rotation supporting mechanism on the supporting apparatus and it is impossible to mount a large rotation driving source and improve the rotational speed. Moreover, pallet replacement is complicated, the apparatus becomes heavier and has a more complex structure, and the carrying speed between vacuum chambers becomes slower. Therefore, it is difficult to improve productivity of an inline-type substrate processing apparatus.

Thus, a substrate supporting apparatus that adopts a structure in which a fulcrum with a rotation function is mounted on a carrier and a pallet is only put on the fulcrum with a rotation function and includes a lift mechanism to lift the pallet to be separated from the carrier and a mechanism that rotatably holds the center section of the pallet in a process chamber can be considered.

According to the apparatus, the pallet and the substrate supporting apparatus are structured to be separable and thus, a structure capable of dealing with various problems concerning Japanese Patent Application Laid-Open No. 07-15773 is provided, but new problems described below arise.

That is, a film is formed while the pallet is separated from the carrier after the pallet on the fulcrum with a rotation function is caused to rise by the lift mechanism set up inside the process chamber while an outer diameter part of the pallet being gripped and the center section of the pallet is rotatably held by a pallet holding/driving mechanism set up inside the chamber. However, since the inner part of the chamber is a high-temperature environment of 100 to 300° C., the outer diameter of the pallet thermally expands with a rising temperature of the pallet and the center position thereof also rises. Accordingly, the pallet holding/driving mechanism does not work normally due to a shifted center position of the pallet during an ascent and descent operation by the lift mechanism, posing a problem that the pallet cannot be held. Moreover, it takes a long time to operate the lift, posing an obstacle to improvement of production tact. Therefore, it is necessary to devise a method of operating the lift such as using adjustments of the lifting position depending on each process condition.

Moreover, the pallet is only put on the fulcrum with a rotation function in this structure. Thus, there is a problem that when an operation abnormality of the mechanism such as an abnormal lift operation and an abnormal pallet holding operation occurs, a carrying abnormality such as a fall of the pallet from the fulcrum with a rotation function occurs, and even without such a fall, and a shift of the holding position occurs. Accordingly, there is a problem of low productivity that an abnormality is more likely to occur in the next process and in some circumstances, maintenance is needed after stopping the production.

In view of the above circumstances, an object of the present invention is to provide a substrate supporting apparatus capable of increasing reliability of pallet holding and reliability of operations by improving a pallet holding structure and improving productivity by preventing carrying abnormalities and an inline-type substrate processing apparatus equipped with such a substrate supporting apparatus.

Further, the present invention provides a substrate supporting method capable of achieving the above object, a control program, and a recording medium.

SUMMARY OF THE INVENTION

The configuration of the present invention made to achieve the above object is as follows.

A substrate supporting apparatus in a first aspect of the present invention includes:

a pallet configured and positioned to mount one or more substrates;

a pallet double-end holding mechanism that is provided in a supporting apparatus body and holds both ends in a diameter direction of the pallet while a substrate mounting surface of the pallet is in a vertical posture;

a pallet center holding mechanism that is arranged in a center section of the mounting surface of the pallet and rotatably holds the center section of the pallet; and a moving mechanism that moves the supporting apparatus body, wherein the pallet double-end holding mechanism is a mechanism that grips the both ends in the diameter direction of the pallet from both sides of a thickness direction thereof and the pallet double-end holding mechanism holds the pallet during movement of the apparatus body, during delivery between holding by the pallet double-end holding mechanism and the holding by the pallet center holding mechanism, the pallet is held by both of the holding mechanisms, and wherein during substrate processing, the center section of the pallet is rotatably held by the pallet center holding mechanism and the holding by the pallet double-end holding mechanism is released.

A substrate supporting apparatus in a second aspect of the present invention includes:

a pallet configured and positioned to mount one or more substrates;

a pallet double-end holding mechanism that is provided in a supporting apparatus body and holds both ends in a diameter direction of the pallet while a substrate mounting surface of the pallet is in a vertical posture;

a pallet center holding mechanism that is arranged in a center section of the mounting surface of the pallet and rotatably holds the center section of the pallet; and a moving mechanism that moves the supporting apparatus body, wherein the pallet double-end holding mechanism is a mechanism that engages with an engaging part provided at the both ends in the diameter direction of the pallet from outside in the diameter direction thereof and the pallet double-end holding mechanism holds the pallet during movement of the apparatus body, during delivery between holding by the pallet double-end holding mechanism and the holding by the pallet center holding mechanism, the pallet is held by both of the holding mechanisms, and wherein during substrate processing, the pallet is rotatably held by the pallet center holding mechanism and the holding by the pallet double-end holding mechanism is released.

According to a substrate supporting apparatus in the first aspect of the present invention, the pallet double-end holding mechanism is a mechanism to grip both ends in the diameter direction of the pallet from both sides of the thickness direction thereof and therefore, the pallet does not fall and no shifts in position occur during transportation. Since the pallet double-end holding mechanism is a mechanism to grip from both sides of the thickness direction, a gripping mechanism, if the pallet thermally expands after being heated, the pallet double-end holding mechanism can shift in the in-plane direction to an extent that allows for an increase of the pallet outside diameter caused by thermal expansion. Further, during delivery between holding by the pallet double-end holding mechanism and holding by the pallet center holding mechanism, the pallet is held by both of the holding mechanisms. Therefore, productivity can be improved by ensuring reliability of pallet holding by the pallet center holding mechanism and reliability of operations thereof and preventing carrying abnormalities without shifts of the center position of the pallet.

According to a substrate supporting apparatus in the second aspect of the present invention, the pallet double-end holding mechanism is a mechanism to engage with an engaging part provided at both ends in the diameter direction of the pallet from outside in the diameter direction thereof and therefore, the pallet does not fall and no shifts in position occur during transportation. Since the pallet double-end holding mechanism is a mechanism to engage with the engaging part from outside in the diameter direction thereof, if the pallet thermally expands after being heated, the pallet double-end holding mechanism can shift in the in-plane direction to an extent that allows for an increase of the pallet outside diameter caused by thermal expansion. Further, during delivery between holding by the pallet double-end holding mechanism and holding by the pallet center holding mechanism, the pallet is held by both of the holding mechanisms.

Therefore, according to the first and second aspects of the present invention, productivity can be improved by ensuring reliability of pallet holding by the pallet center holding mechanism and reliability of operations thereof and preventing carrying abnormalities without shifts of the center position of the pallet.

DESCRIPTION OF THE PREFERRED EMBODIMENT

Embodiments of the present invention will be described below with reference to drawings, but the present invention is not limited to these embodiments.

First Embodiment

An inline-type substrate processing apparatus, a substrate supporting apparatus, a control program of the substrate supporting apparatus, and a recording medium according to the first embodiment will be described with reference to FIGS. 1 to 6.

[Configuration of the Inline-Type Substrate Processing Apparatus]

Figure 1:
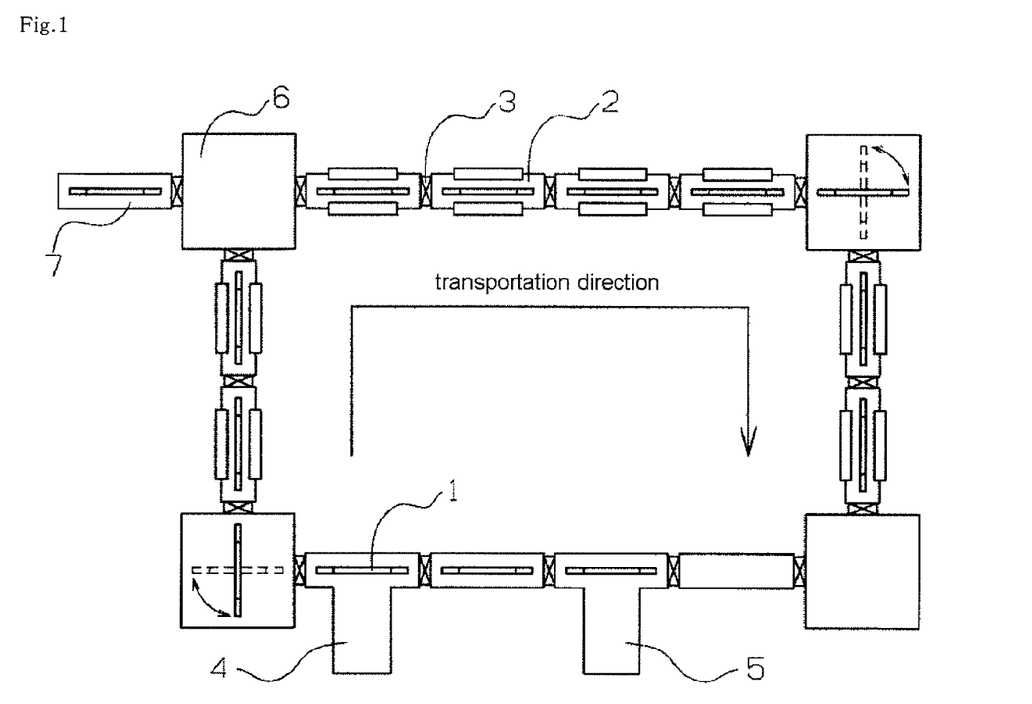
FIG. 1 is a plan view exemplifying an outline configuration of an inline-type substrate processing apparatus according to the present invention.

First, an outline configuration of the inline-type substrate processing apparatus according to the present invention will be provided with reference to FIG. 1. FIG. 1 is a plan view exemplifying an outline configuration of an inline-type substrate processing apparatus according to the present invention.

As shown in FIG. 1, the inline-type substrate processing apparatus according to the present invention is an apparatus in which a plurality of vacuum chambers is hermetically connected along a transportation direction of a substrate 12 (see FIG. 2) and vacuum film formation processing is continuously performed on the substrate 12. That is, the plurality of vacuum chambers 2 including a process chamber 2 is hermetically connected and is used, for example, for production of magnetic disks. In the substrate processing apparatus according to the present embodiment, the plurality of vacuum chambers 2 is connected and arranged in an endless form, for example, like forming a rectangular loop, but the number of chambers and the arrangement form are not limited. Each vacuum chamber 2 is a vacuum vessel evacuated by a dedicated or general exhaust system. A gate valve 3 is interposed in a boundary portion of each vacuum chamber 2 where each vacuum chamber 2 is connected while maintaining an airtight state.

In a vacuum space in this substrate processing apparatus, a substrate is mounted onto the carrier (corresponding to a substrate supporting apparatus of the present invention) 1 before being carried between the vacuum chambers. A carrying path (carrying track) of the carrier 1 is set up inside the plurality of the connected vacuum chambers 2 and a magnet-type carrying mechanism (moving mechanism) (not shown) to move the carrier 1 along the carrying path is built below an apparatus body (holder) 9 (see FIG. 2). While the magnet-type carrying mechanism is adopted in the present embodiment, a carrying mechanism of other types such as a gearing system like a rack and pinion mechanism may also be adopted.

Among the plurality of the vacuum chambers 2 of the substrate processing apparatus, two chambers arranged on a side of the rectangle are a substrate feeding chamber 4 that feeds a substrate to the carrier 1 and a substrate discharging chamber 5 that collects substrates from the carrier 1. A directional change chamber 6 equipped with a directional change mechanism capable of changing the transportation direction of the carrier 1 by 90 degrees is provided at each corner section of the rectangle. A feeding/discharging chamber 7 of the carrier 1 is connected to one of the directional change chambers 6 via the gate valve 3.

A target supporter (not shown) that performs vacuum thin film formation is arranged inside the process chamber and a target fixed to the target supporter has a concentric circle shape with respect to the rotation center of the pallet while the carrier 1 is at rest in the chamber so as to face both sides of the pallet.

[Structure of the Carrier 1]

Figure 2:
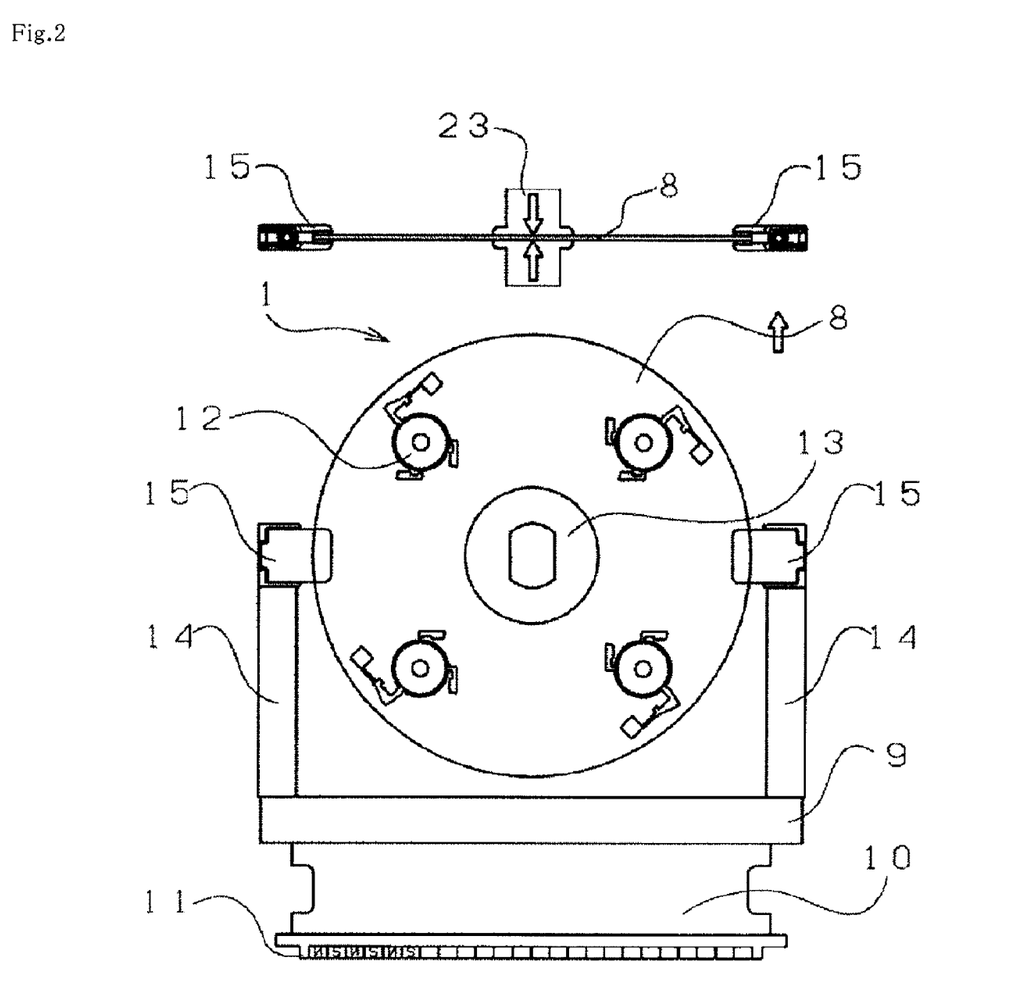
FIG. 2 is a front view and a top view showing the outline configuration of a substrate supporting apparatus in a first embodiment.

Next, the structure of the carrier 1 as a substrate supporting apparatus carried between the vacuum chambers will be described with reference to FIG. 2. FIG. 2 is a front view and a top view showing the outline configuration of a substrate supporting apparatus in the first embodiment.

As shown in FIG. 2, the carrier 1 includes a pallet 8 onto which the one or more substrates 12 are mounted, a tray-shaped supporting apparatus body (apparatus body) 9, and arms 14 and holding members 15 provided at both ends of the apparatus body 9 and holding both ends in a diameter direction of the pallet 8.

The pallet 8 has a shape of a disk, includes the plurality of substrates 12 mounted on both sides (mounting surface) thereof, and is held by the pallet double-end holding mechanism while the substrate mounting surface is in a vertical posture. The pallet 8 in the present embodiment has, for example, four substrates 12 mounted at equal intervals in a circumferential direction, but the number of mounted substrates is not limited to this. In view of outside diameter dimensions of the pallet accommodated in the vacuum chamber 2 and the size of mounted substrates, for example, the practical number of mounted substrates is 4, 8, 12, or 16.

The pallet double-end holding mechanism has the arms 14 arranged at both ends of the apparatus body 9 in an erect state in the vertical direction (vertically) and holding members 15 provided at a tip end thereof and holding both ends in the diameter direction of the pallet 8 on an extended line of a horizontal central line of the pallet 8. The holding member 15 is a clip mechanism capable of holding the pallet 8 in a vertical posture by clipping both ends in the diameter direction of the pallet 8 from both sides of a thickness direction and is provided on an extended line of a pallet horizontal direction central line. The holding member 15 is detachable from both ends in the diameter direction of the pallet 8 during substrate processing by being energized by a clip release mechanism 24 that causes the holding member 15 to release gripping (clipping force) by giving an external force thereto. The clip release mechanism 24 will be described later.

A slider 10 having a carrying magnet 11 to establish magnetic connection to the magnet-type carrying mechanism to move the carrier 1 between the vacuum chambers is fixed below the apparatus body 9. In the present embodiment, the carrying magnet 11 is fixed to the slider 10 corresponding to the magnet-type carrying mechanism, but the present invention is not limited to this. For example, a rack of the rack and pinion mechanism may also be fixed.

A pallet center holding mechanism 13 to rotatably hold the center of the pallet 8 is arranged in the center section of the mounting surface of the pallet 8. The pallet center holding mechanism 13 is driven to rotate by a pallet holding/driving mechanism 23 set up inside each vacuum chamber 2. The pallet center holding mechanism 13 in the present embodiment is formed as a hole opened in a long shape. As other types of the pallet holding/driving mechanism 23, for example, a general connection mechanism of the chuck type, cross recess type, pin insertion type, gear type and the like can be mounted. That is, the pallet center holding mechanism 13 holds the pallet 8 by moving to the center section of the pallet 8 during substrate processing and is connected to the pallet holding/driving mechanism 23 withdrawing from the center section of the pallet 8 during movement of the apparatus body 9.

[Concrete Configuration of the Pallet Double-End Holding Mechanism]

Figure 3A:
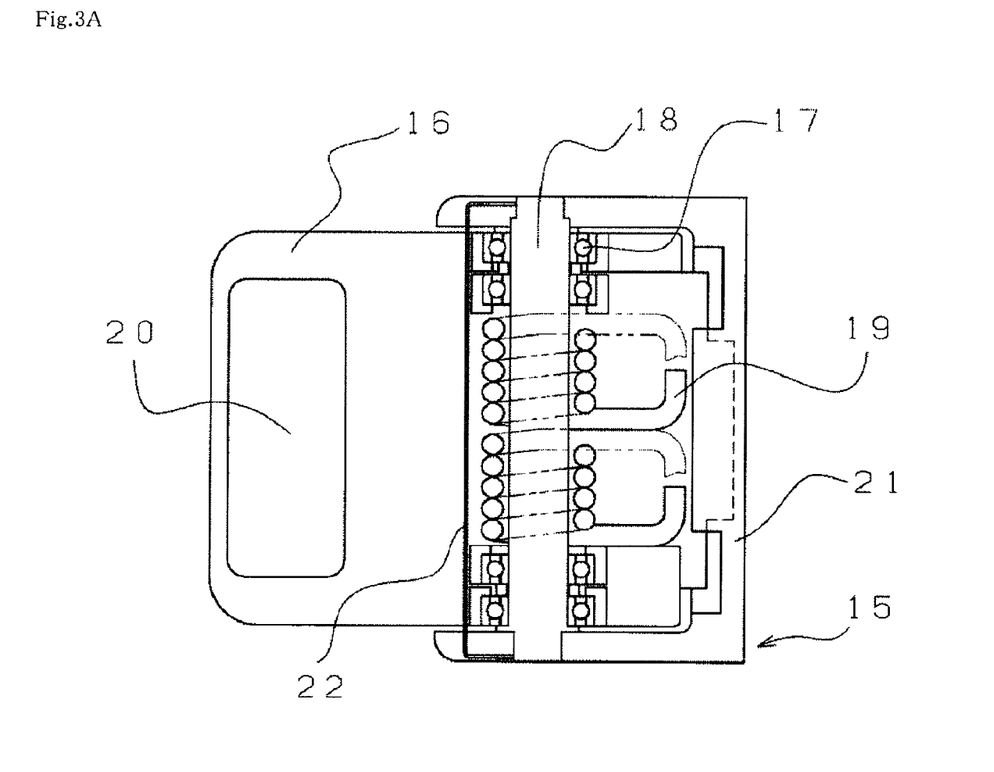
FIG. 3A is an outline front sectional view showing the configuration of a pallet double-end holding mechanism in the first embodiment.
Figure 3B:
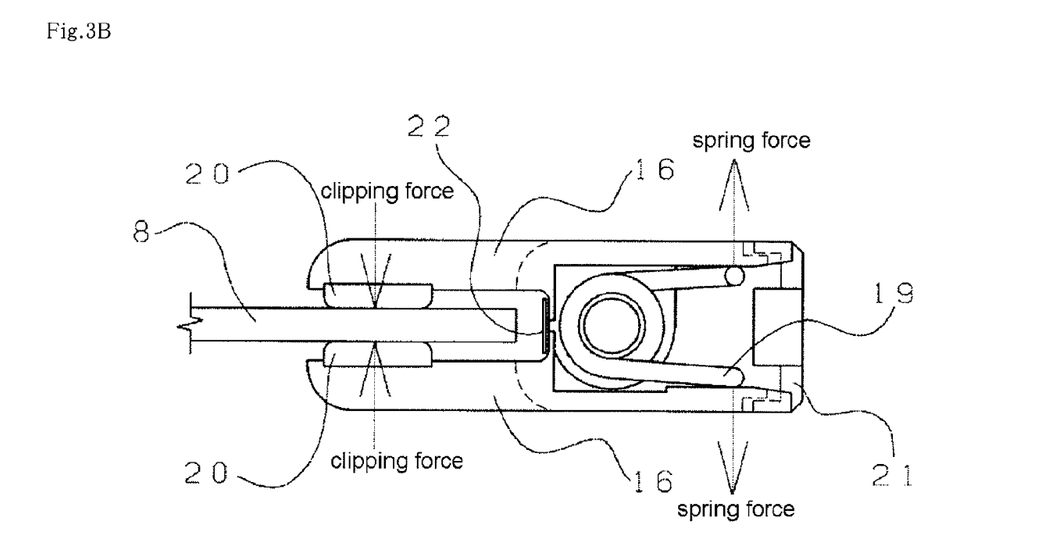
FIG. 3B is an outline top sectional view showing a closed state of the pallet double-end holding mechanism in the first embodiment.
Figure 3C:
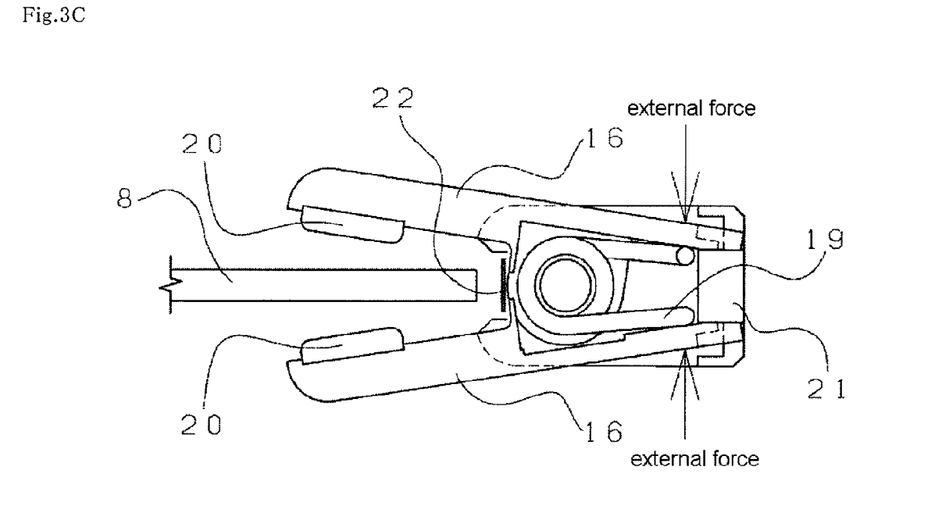
FIG. 3C is an outline top sectional view showing an opened state of the pallet double-end holding mechanism in the first embodiment.

Next, a concrete structure of the pallet double-end holding mechanism will be described with reference to FIGS. 3A, 3B, and 3C. FIG. 3A is an outline front sectional view showing the configuration of the pallet double-end holding mechanism in the first embodiment. FIG. 3B is an outline top sectional view showing a closed state of the pallet double-end holding mechanism in the first embodiment. FIG. 3C is an outline top sectional view showing an opened state of the pallet double-end holding mechanism in the first embodiment.

As shown in these drawings, the pallet double-end holding mechanism is a holding mechanism capable of gripping the substrate mounting surface of the pallet 8 in a vertical posture by clipping both ends or vicinities thereof of the outside diameter of the pallet 8 from both sides of the thickness direction. That is, the pallet double-end holding mechanism includes a pair of outer shell plates 16 capable of opening/closing. The opening/closing mechanism of the outer shell plates 16 is assembled by arranging bearings 17 at both ends in the width direction between the outer shell plates 16 and linking the bearings 17 by a shaft 18 so that the outer shell plates 16 open/close with the shaft 18 acting as the center thereof. Further, coil springs 19 are arranged around the shaft 18 so that an energizing force acts in such a way that the coil springs 19 push out one end of the outer shell plates 16 with the shaft 18 acting as the center thereof.

Pads 20 as a cushioning material are arranged inside the outer shell plates 16 on contact portions clipping the pallet 8 and can easily be replaced when worn out.

The pallet double-end holding mechanism in the present embodiment is formed as a clip mechanism capable of holding such as clipping both ends in the diameter direction of the pallet 8 from both sides of the thickness direction of the pallet 8. The clip mechanism holds both ends in the diameter direction of the pallet 8 with a spring force of the coil spring 19 acting to clip the pallet 8 when no external force acts on the outer shell plates 16. By applying an external force in a direction to compress the spring on the outer shell plates 16, the pad 20 expands in a direction to separate from the pallet 8 to release holding of the pallet 8.

In the present embodiment, a structure making use of a spring force of the coil spring 19 is adopted, but the present invention is not limited to this, and a plate spring or a magnet may also be adopted. Moreover, a structure constructed from a component that generates a grip force by releasing an external force, holds the pallet 8 when no external force is applied, and can release holding of the pallet 8 by applying an external force may be adopted.

A case 21 is provided between external providing sides of the outer shell plates 16. The case 21 has a stopper (not shown) to prevent the outer shell plates 16 from being closed too much by a spring force in the closing direction when the pallet 8 is not present and a stopper to prevent the outer shell plates 16 from being spread too much by an external force in the opening direction arranged therein. A vacuum thin film formation process is performed while the pallet 8 is released by spreading the outer shell plates 16 in the opening direction and therefore, a shield 22 to prevent exposure of internal components is arranged so that a film should not be formed on an internal component of the pallet double-end holding mechanism such as the coil spring 19.

Figure 4:
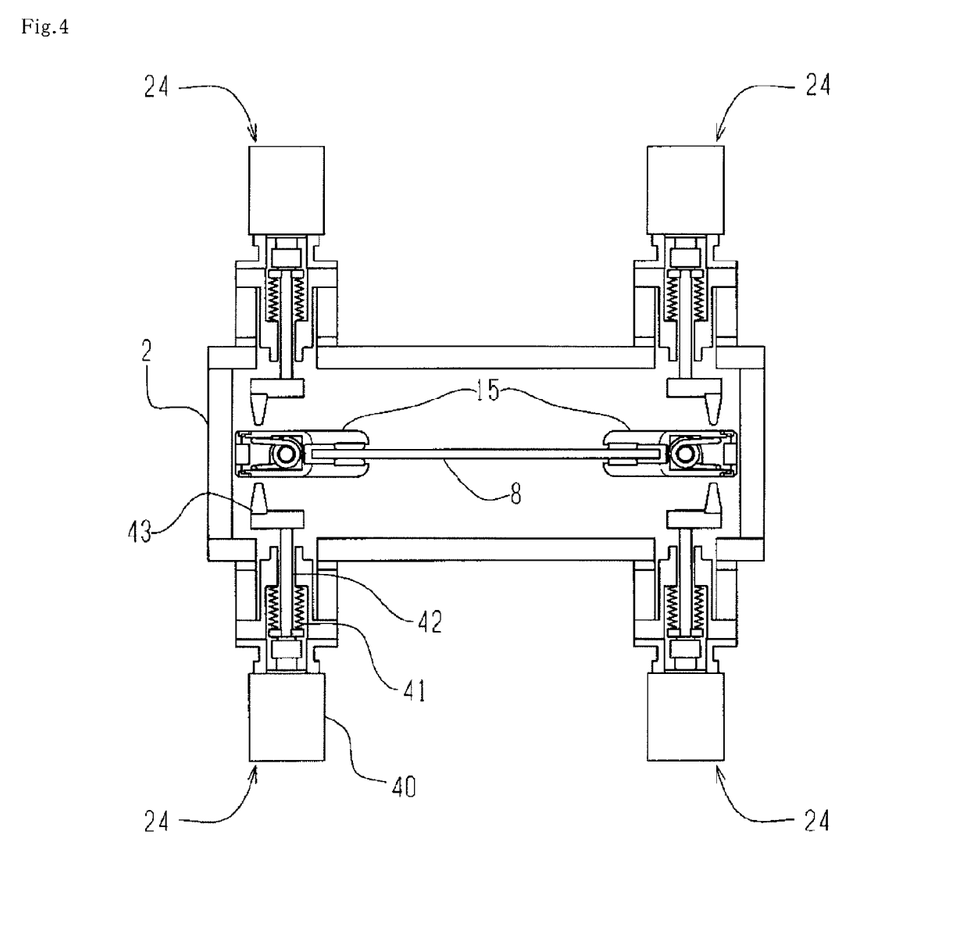
FIG. 4 is an outline top sectional view showing a structure of a clip release mechanism in the first embodiment.

Next, a concrete structure of the clip release mechanism 24 that applies an external force to the pallet double-end holding mechanism will be described with reference to FIG. 4. FIG. 4 is an outline top sectional view showing a structure of a clip release mechanism in the first embodiment.

As shown in FIG. 4, the release mechanism 24 is a mechanism to detach the pallet double-end holding mechanism from both ends in the diameter direction of the pallet 8 by applying an external force to the outer shell plates 16 of the pallet double-end holding mechanism to release a clipping force. More specifically, the clip release mechanism 24 is arranged at a position facing the pallet double-end holding mechanism mounted at both ends of the carrier 1 stopped inside the vacuum chamber 2 and two pairs of the clip release mechanisms 24 are arranged so that an external force can be given to the outer shell plates 16 of the pallet double-end holding mechanism from both sides.

The clip release mechanism 24 includes a bellows 41 as a sealing member having airtightness and stretching properties and a connection shaft 42 inserted into the bellows 41 and a presser part 43 is provided at a tip end of the cylinder rod 42. The rear end of the cylinder rod 42 is connected to a cylinder apparatus 40, which applies an external force by driving in a shaft direction of the cylinder rod 42 to press the presser part 43 against the outer shell plates 16 of the pallet double-end holding mechanism before the pallet 8 being released. At this point, two pairs of the cylinder apparatuses 40 operate almost at the same time and the operation of the clip release mechanism 24 is controlled so that the carrier 1 is not tilted.

Figure 5:
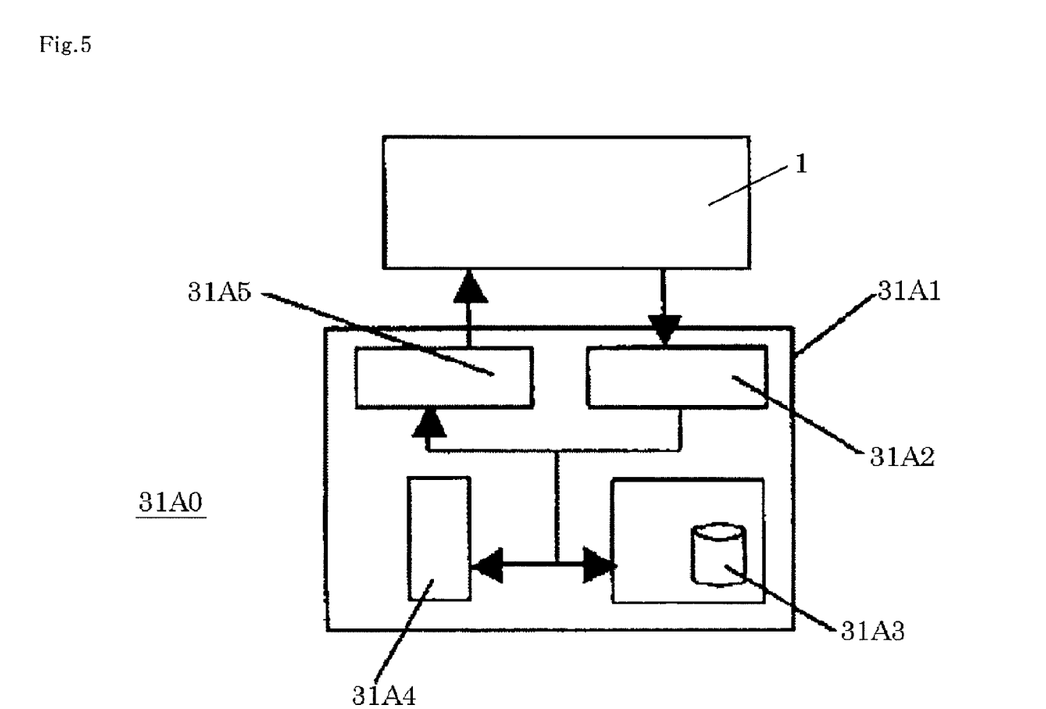
FIG. 5 is a block diagram exemplifying a controller.

Next, a controller provided with the substrate supporting apparatus 1 in the present embodiment and controls the operation thereof will be described with reference to FIG. 5. FIG. 5 is a block diagram exemplifying a controller.

As shown in FIG. 5, the substrate supporting apparatus 1 in the present embodiment includes a controller 31A0 to control operations of a series of pallet holding mechanisms. That is, the process controller 31A0 receives an input signal from the substrate supporting apparatus 1 and, based on the control programs to operate a series of pallet holding mechanisms, outputs operation instructions to the substrate supporting apparatus 1. The process controller 31A0 has each basic component of a general computer 31A1. That is, the process controller 31A0 includes an input unit 31A2, a storage unit 31A3 to store programs and data, a processor (CPU) 31A4, and an output unit 31A5 and controls corresponding apparatuses.

The processor 31A4 carries out control of each of the above units according to the control program and various kinds of arithmetic processing. The storage unit 31A3 is composed of an HDD or ROM that stores various programs and data in advance or a RAM that temporarily stores programs or data as a working area. In addition to the data input function from the substrate supporting apparatus 1, the input unit 31A2 enables input of instructions from outside.

[Operation Effect of the Pallet Holding Mechanism, the Substrate Supporting Method, Control Program, and Recording Medium]

Figure 6:
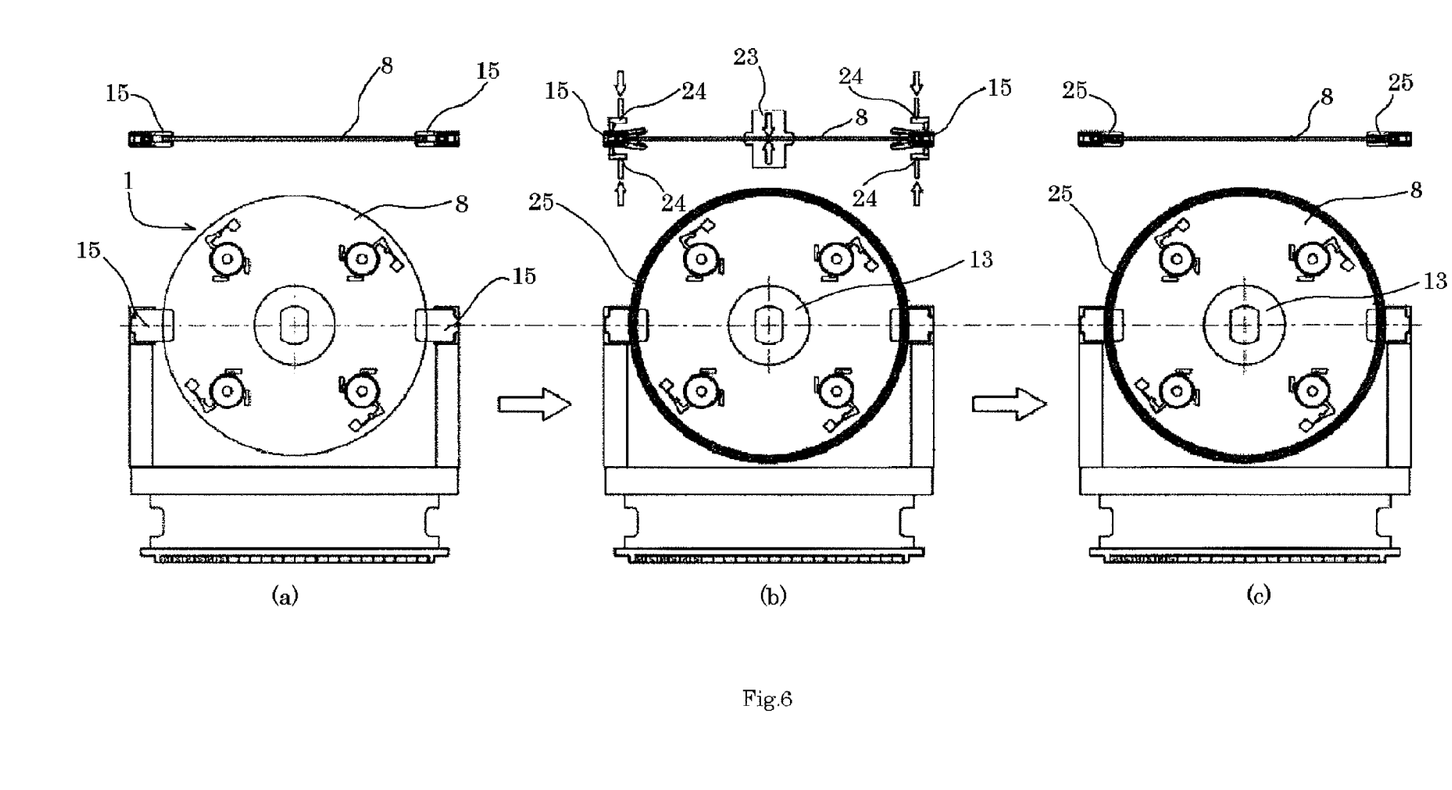
FIG. 6 is a diagram illustrating an operation of the pallet holding mechanism in the first embodiment.

Next, operation of the substrate supporting apparatus 1 in the present embodiment and also the substrate supporting method according to the present embodiment executed by using the apparatus 1 will be described with reference to FIGS. 6A to 6C. FIG. 6 is a diagram illustrating the operation of the pallet holding mechanism in the first embodiment. An algorithm of the substrate supporting method in the first embodiment is stored as a control program in the storage unit 31A3 of the controller 31A0 and is read and executed by the processor 31A4 before the operation is started.

Here, the control program has a procedure for holding the pallet 8 by gripping both ends in the diameter direction of the pallet 8 from both sides of the thickness direction thereof by the pallet double-end holding mechanism during movement of the apparatus body. During delivery between holding by the pallet double-end holding mechanism and holding by the pallet center holding mechanism 13, the control program has a procedure for holding the pallet 8 by both of the holding mechanisms. Further, during substrate processing, the control program has a procedure for holding the pallet 8 rotatably around the center section thereof by the pallet center holding mechanism 13 and releasing the holding by the pallet double-end holding mechanism.

The control program in the first embodiment is recorded in a recording medium readable by the controller 31A0 such as a computer (PC) before being installed into the storage unit 31A3 of the controller 31A0.

The recording medium includes a magnetic recording medium such as a floppy (registered trademark) disk and ZIP (registered trademark), a magneto-optical recording medium such as MO, and an optical disk such as CD-R, DVD-R, DVD+R, DVD-RAM, DVD+RAM (registered trademark), and PD. The recording medium also includes a flash memory such as CompactFlash (registered trademark), SmartMedia (registered trademark), Memory Stick (registered trademark), and SD and a removable disk such as Microdrive (registered trademark) and Jaz (registered trademark).

First, FIG. 6A shows a state where the carrier 1 moves between the vacuum chambers and a state of the carrier 1 during transportation before a process being executed. For convenience of description, this state is assumed to be a state in which the pallet 8 is not thermally expanded at all. The substrate mounting surface of the pallet 8 is held aligning with a vertical posture by both ends in the diameter direction of the pallet 8 being clipped by the pallet holding mechanism from both sides of the thickness direction. When the carrier 1 moves between the vacuum chambers, the pallet holding/driving mechanism 23 is not connected to the pallet center holding mechanism 13 arranged in the center section of the pallet 8.

FIG. 6B shows a state of the carrier 1 during process treatment (during substrate processing). After being stopped in the vacuum chamber 2 in the state of FIG. 6A, the pallet holding/driving mechanism 23 set up inside the vacuum chamber 2 connects to the pallet center holding mechanism 13 to hold the center section of the pallet 8 rotatably. Further, holding of the pallet 8 is released by applying an external force in a direction to release the pallet 8 to the pallet double-end holding mechanism through the clip release mechanism 24 set up in the vacuum chamber 2.

In this state, the pallet 8 stops or rotates while process treatment is being performed. Thermal expansion of the pallet 8 occurs during a process of sputtering or heating. An increase in area 25 due to thermal expansion of the pallet 8 is indicated by a hatching portion in an exaggerated manner. The actually produced pallet 8 made of A5052 has an outside diameter of 590 mm and thermal expansion determined by calculation from room temperature 20° C. to 300'C (temperature rise of 280 degrees) is about 4 mm.

Further, FIG. 6C shows a state where the carrier 1 moves between the vacuum chambers and a state of the carrier 1 after the process treatment being performed and thermally expanded. After the process treatment being completed, the clip release mechanism 24 is detached from the pallet holding mechanism to hold both ends in the diameter direction of the pallet 8 by the pallet holding mechanism. Moreover, the pallet holding/driving mechanism 23 is detached from the pallet center holding mechanism 13 to release the center section of the pallet 8. While this state is a holding state of the pallet 8 like the state shown in FIG. 6A, the pallet double-end holding mechanism is a gripping mechanism and can shift in an in-plane direction by shifting the gripping position of the pallet 8 and thus, the pallet 8 can be held by allowing for the increase in area 25 of the pallet outside diameter caused by thermal expansion. Both ends in the diameter direction of the pallet 8 are held by the pallet double-end holding mechanism while the center section of the pallet 8 is held by the pallet center holding mechanism 13 and the pallet holding/driving mechanism 23. Therefore, the pallet 8 is held in a vertical posture by clipping both ends in the diameter direction of the pallet 8 in the thickness direction without being affected by thermal expansion of the pallet 8 and the position of the pallet center holding mechanism 13 maintains the position before thermal expansion in FIG. 6A.

According to a substrate processing apparatus and a substrate supporting apparatus in the first embodiment, as described above, the pallet double-end holding mechanism is a mechanism to grip both ends in the diameter direction of the pallet 8 from both sides of the thickness direction thereof and therefore, the pallet does not fall and no shifts in position occur during transportation. Since the pallet double-end holding mechanism is, as described above, a gripping mechanism, if the pallet 8 thermally expands after being heated, the pallet double-end holding mechanism can shift in the in-plane direction to an extent that allows for the increase 25 of the pallet outside diameter caused by thermal expansion. Further, during delivery between holding by the pallet double-end holding mechanism and holding by the pallet center holding mechanism 13, the pallet 8 is held by both of the holding mechanisms.

Thus, a change of the pallet center holding position due to changes of outside diameter dimensions of the pallet 8 caused by thermal expansion can be minimized. Therefore, the pallet holding operation in the process chamber can be performed with stability so that there is no need to adjust each mechanism operation for each process condition. Further, an influence of dimension changes caused by thermal expansion of the pallet 8 on the pallet double-end holding mechanism is minimized and also the pallet 8 is fixed to the carrier 1 via the pallet double-end holding mechanism and thus, the pallet 8 is held with stability. Therefore, productivity can be improved by ensuring reliability of pallet holding by the pallet holding mechanisms and reliability of operations thereof and preventing carrying abnormalities without shifts of the center position of the pallet 8.

Further, a conventional lift mechanism to move the pallet up and down becomes unnecessary. Therefore, according to the present invention, the production has a sequence of five operations, namely, holding the pallet center→releasing the pallet double-end holding mechanism→film formation process→holding the pallet→releasing pallet center holding so that the production tact can be shortened. According to a conventional technology, the production has a sequence of seven operations, namely, lifting the pallet→holding the pallet center→lowering the lift→film formation process→lifting the lift→releasing pallet center holding→lowering the pallet.

Second Embodiment

The inline-type substrate processing apparatus, substrate supporting apparatus, control program of the substrate supporting apparatus, and recording medium according to the second embodiment will be described with reference to FIGS. 7A, 7B, and 8. The configuration of the inline-type substrate processing apparatus including a substrate supporting apparatus 7 is the same as that of the first embodiment and therefore, description thereof will not be repeated here. The same reference numerals are given to the same components as those in the first embodiment for description.

[Structure of the Carrier 1 and a Concrete Example of the Pallet Double-End Holding Mechanism]

Next, the structure of the carrier 1 as a substrate supporting apparatus carried between the vacuum chambers will be described with reference to FIGS. 7A and 7B. FIG. 7A is a front view showing the substrate supporting apparatus in the second embodiment. FIG. 7B is a front view showing the opened state of the pallet double-end holding mechanism in the second embodiment.

Figure 7A:
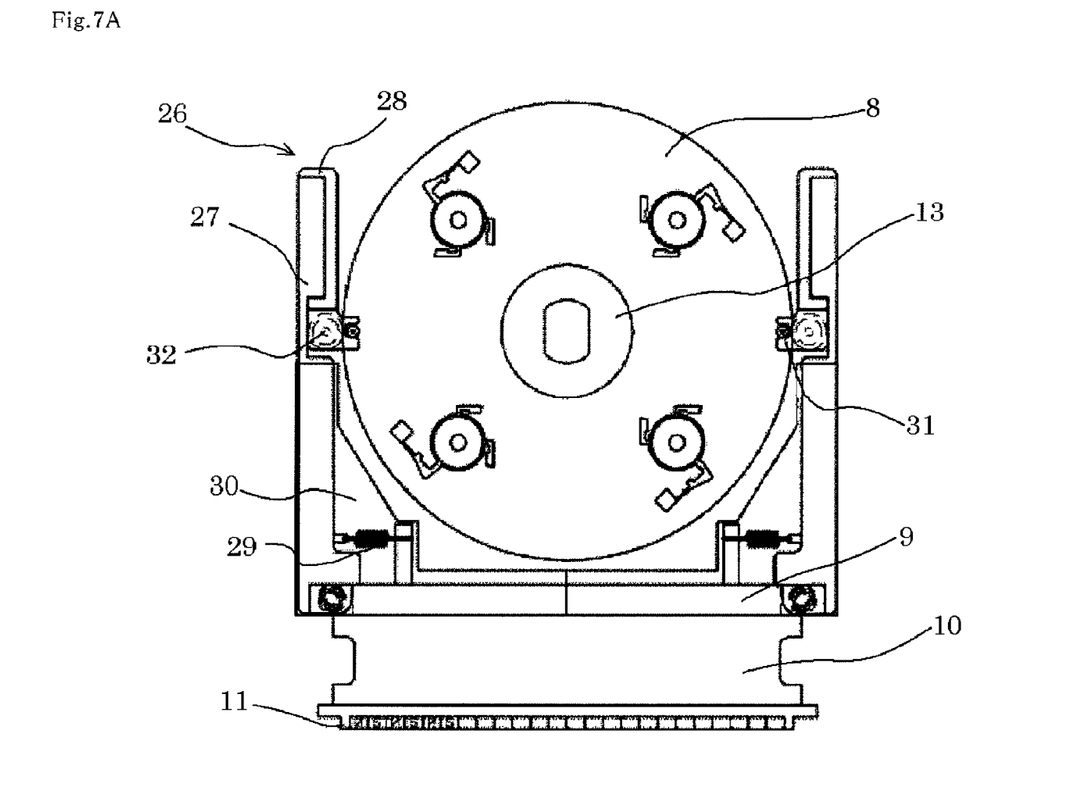
FIG. 7A is a front view showing the substrate supporting apparatus in a second embodiment.
Figure 7B:
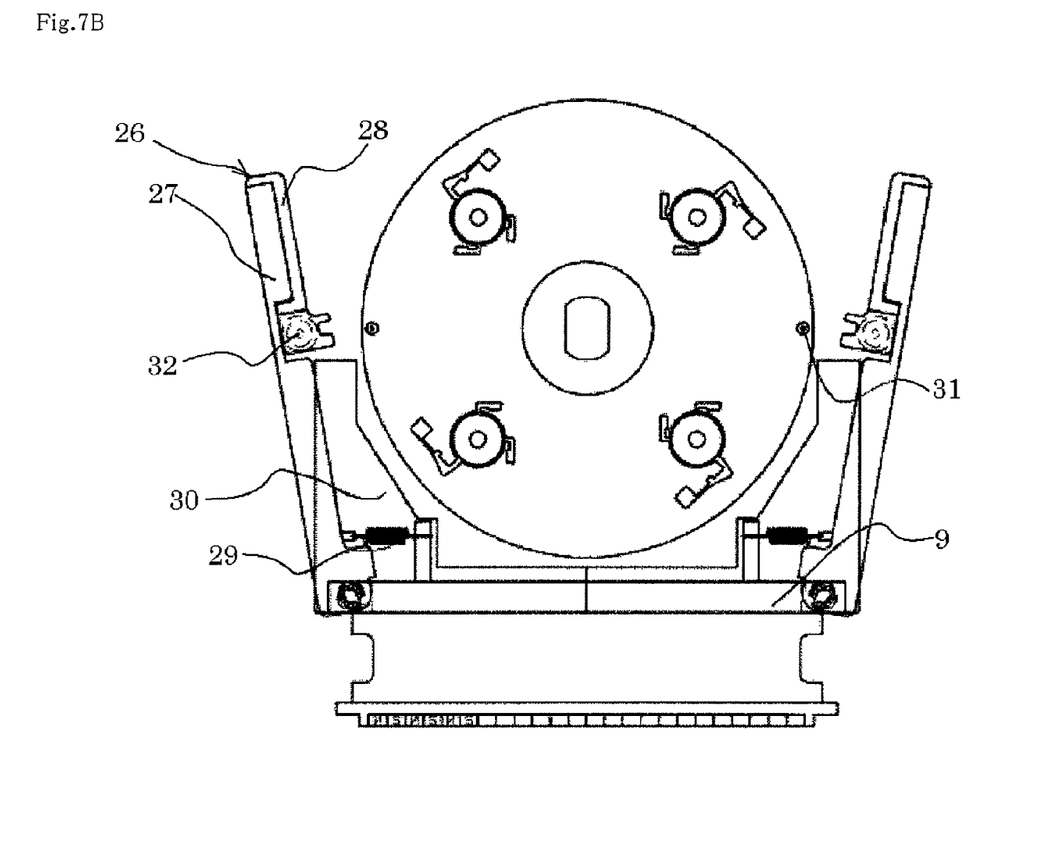
FIG. 7B is a front view showing the opened state of the pallet double-end holding mechanism in the second embodiment.

As shown in FIG. 7A, the carrier 1 includes the pallet 8 onto which the one or more substrates 12 are mounted, the tray-shaped supporting apparatus body (apparatus body) 9, and a pallet double-end holding mechanism 26 provided at both ends of the apparatus body 9 and holding both ends in the diameter direction of the pallet 8. The configuration of the pallet 8 on which the one or more substrates 12 are mounted is the same as that of the first embodiment.

The pallet double-end holding mechanisms 26 are arm mechanisms engaged with engaging parts 31 provided at both ends in the diameter direction of the pallet 8 and are arranged at both ends of the pallet horizontal direction central line in an erect state in the vertical direction (vertically). The pallet double-end holding mechanisms 26 withdraw from the engaging parts 31 at both ends in the diameter direction of the pallet 8 during substrate processing and have an engagement means for holding the pallet 8 by moving to both ends in the diameter direction of the pallet 8 during movement of the apparatus body 9.

More specifically, the engaging parts 31 provided at both ends in the diameter direction of the pallet 8 are formed from a pair of pins projecting from the mounting surface of the pallet 8 outward in the thickness direction and the pins 31 face each other via the center section of the pallet 8.

A bifurcated engaging member 32 having a groove in the center section thereof is provided in a portion (on an extended line of the pallet horizontal direction central line) of the arm mechanism 26 and the groove of the engaging member 32 is engaged with the pin 31. In the present embodiment, the pin 31 is provided at both ends in the diameter direction of the pallet 8, but the present invention is not limited to this and a groove may also be provided. In such a case, the side of the engaging member 32 is considered to be replaced with a pin. The engaging part 31 and the engaging member 32 only need to engage with each other and are not limited to a pin and groove and other mechanisms may also be adopted.

The arm mechanism 26 is provided rotatably (openably and closably) with a base end thereof acting as the center and is energized in a closing direction by a coil spring 29. That is, the coil spring 29 is arranged between the lower part of the arm mechanism and the apparatus body 9, the pallet 8 can be held in a vertical posture while no external force is applied, and holding of the pallet 8 can be released by applying an external force. Incidentally, a shield 30 is arranged to cover components such as the coil spring 29 so that a film should not be attached to those structural components during the process of vacuum thin film formation.

In the present embodiment, a structure using an energizing force of the coil spring 29 is adopted, but the present invention is not limited to this and a plate spring or a magnet may also be adopted as an opening/closing force. Moreover, a structure constructed from a component that generates a grip force by releasing an external force, holds the pallet 8 when no external force is applied, and can release holding of the pallet 8 by applying an external force may be adopted.

The arm mechanism 26 is compositely formed by combining two or more materials of different linear thermal expansion coefficients. In the present embodiment, two materials of a relatively large linear expansion coefficient and a small linear expansion coefficient are used to construct the arm mechanism 26, but the types and number of materials to be combined are not limited.

More specifically, in the present embodiment, as two materials of different thermal expansion coefficients, for example, titanium (TP340, linear thermal expansion coefficient: 8.4E-6) used as a material whose linear thermal expansion coefficient is small and aluminum (A5052, linear thermal expansion coefficient: 23.8E-6) as a material whose linear thermal expansion coefficient is large. The length of the arm to be formed by each of those materials is determined from the ratio of linear thermal expansion coefficients. The ratio of linear thermal expansion coefficients of titanium and aluminum is about 1:2.8 and thus, the ratio of length of an arm A27 produced from titanium and an arm B28 produced from aluminum will be configured to be 2.8:1.

The arm S27 is put in a standing position, the arm B28 is fixed to the upper tip thereof to configure the arm in such a way that the directions of thermal expansion are opposite to each other, and the engaging member 32 to hold the pallet 8 is provided to the tip end of the arm B28. When the pallet is held, the arm mechanism 26 is fixed to the apparatus body 9 via bearings (not shown) so that the arm mechanism 26 is openable and closable to the left and right following a change of the outside diameter of the pallet 8 caused by thermal expansion so that the arm mechanism 26 can hold the pallet by clipping the pin 31 of the pallet 8 from outside in the diameter direction.

Therefore, when the pallet 8 thermally expands after being heated, the engaging member 32 shifts the engagement position of the engaging part of the pallet 8 by opening/closing and moving the arm mechanism 26 to the left and right to allow for an increase in area of the pallet 8 caused by thermal expansion. Thermal expansion of the arm itself is canceled each other by a difference of thermal expansion of the arm A27 and the arm B28 configured based on the ratio of thermal expansion coefficients.

The slider 10 having the carrying magnet 11 to establish magnetic connection to the magnet-type carrying mechanism to move the carrier 1 between the vacuum chambers is fixed below the apparatus body 9. As described in the first embodiment, for example, a rack of the rack and pinion mechanism may also be fixed to the slider 10.

The pallet center holding mechanism 13 to rotatably hold the center of the pallet 8 is arranged in the center section of the mounting surface of the pallet 8. Similarly to the first embodiment, the pallet center holding mechanism 13 is formed as a hole opened in a long shape and is driven to rotate by the pallet holding/driving mechanism 23 set up inside each vacuum chamber 2 (see FIG. 8). As other types of the pallet holding/driving mechanism 23, similarly to the first embodiment, for example, a general connection mechanism of the chuck type, cross recess type, pin insertion type, gear type and the like can be mounted.

Further, the substrate supporting apparatus 1 in the second embodiment includes a controller 31A, but the configuration thereof is similar to that in the first embodiment and thus, a description thereof will not be repeated here.

[Operation Effect of the Pallet Holding Mechanism, the Substrate Supporting Method, Control Program, and Recording Medium]

Next, operation of the substrate supporting apparatus 1 in the second embodiment and also the substrate supporting method in the second embodiment executed by using the apparatus 1 will be described with reference to FIGS. 8A to 8C. FIG. 8 is a schematic diagram illustrating the operation of a pallet holding mechanism. The algorithm of the substrate supporting method in the second embodiment is stored as a control program in the storage unit 31A3 of the controller and is read and executed by the processor 31A4 before the operation is started (see FIG. 5).

Here, the control program has a procedure for engaging with the engaging part 31 provided at both ends in the diameter direction of the pallet 8 from outside in the diameter direction by the pallet double-end holding mechanism 26 during movement of the apparatus body. During the delivery between holding by the pallet double-end holding mechanism 26 and holding by the pallet center holding mechanism 13, the control program has a procedure for holding the pallet 8 by both of the holding mechanisms 13 and 26. Further, during substrate processing, the control program has a procedure for holding the pallet 8 rotatably around the center section thereof by the pallet center holding mechanism 13 and releasing holding by the pallet double-end holding mechanism 26.

The control program in the second embodiment is recorded in a recording medium readable by the controller 31A0 such as a computer (PC) before being installed into the storage unit 31A3 of the controller 31A0 (see FIG. 5). Recording media include those cited in the first embodiment.

Figure 8:
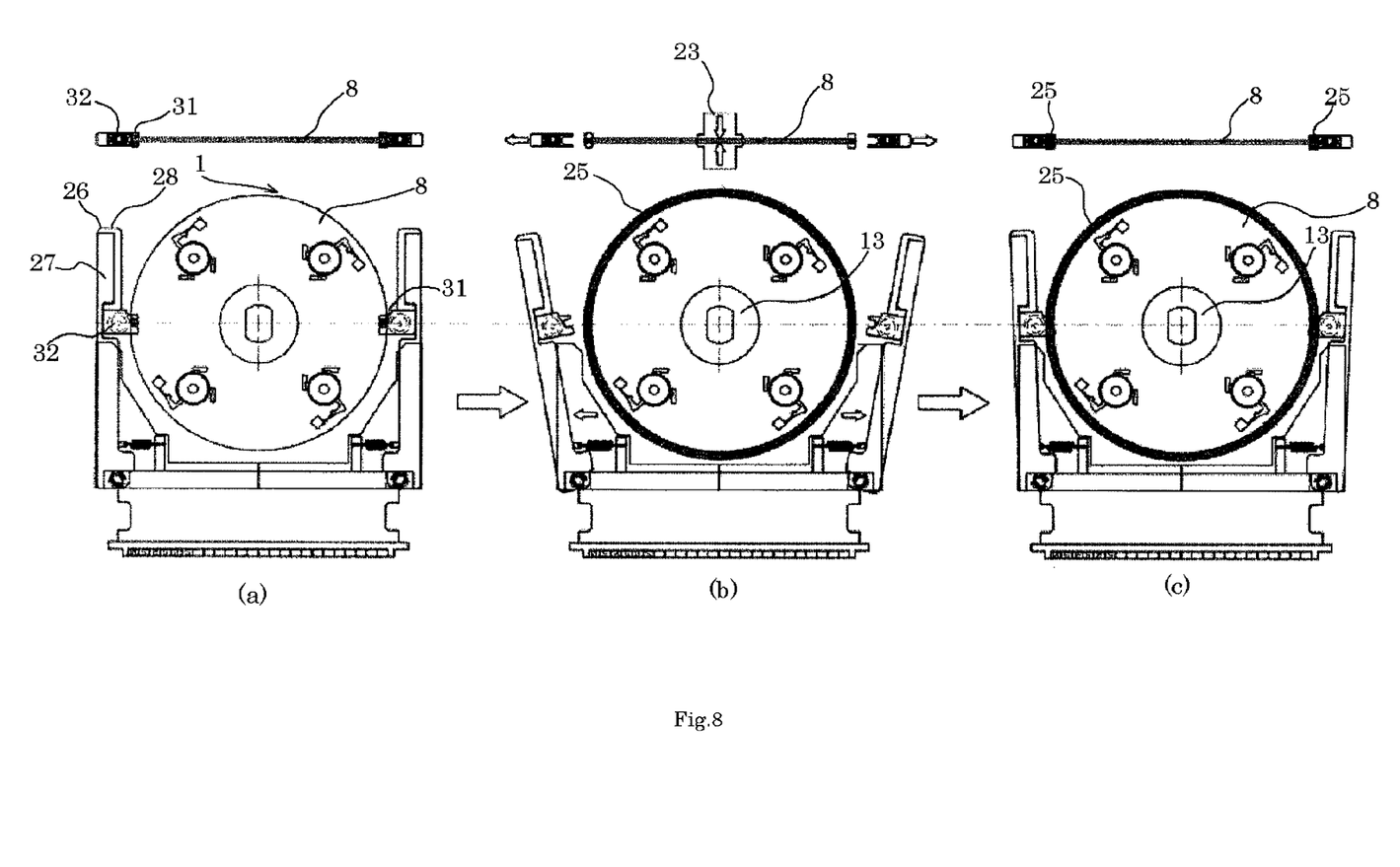
FIG. 8 is a schematic diagram illustrating the operation of the pallet holding mechanism in the second embodiment.

First, FIG. 8A shows a state where the carrier 1 moves between the vacuum chambers and a state of the carrier 1 during transportation before process treatment being performed. For convenience of description, this state is assumed to be a state in which the pallet 8 is not thermally expanded at all. The pins 31 provided at both ends in the diameter direction of the pallet 8 are positioned horizontally and the pins 31 are engaged with the engaging members 32 at the tip end of the arm mechanisms 26 set up in an erect state vertically at both ends of the apparatus body 9 on an extended line thereof to hold the substrate mounting surface of the pallet 8 by aligning with the vertical posture. When the carrier 1 moves between the vacuum chambers, the pallet holding/driving mechanism 23 is not connected to the pallet center holding mechanism 13 arranged in the center section of the pallet 8.

FIG. 8B shows a state of the carrier 1 during process treatment (during substrate processing). After being stopped in the vacuum chamber 2 in the state of FIG. 8A, the pallet holding/driving mechanism 23 set up inside the vacuum chamber 2 is connected to the pallet center holding mechanism 13 to hold the center section of the pallet 8 rotatably. Further, holding of the pallet 8 is released by applying an external force in a direction to release the pallet 8 to the arm mechanisms 26 through an arm opening/closing mechanism (not shown) set up in the vacuum chamber 2.

In this state, the pallet 8 stops or rotates while process treatment is being performed. Thermal expansion of the pallet 8 occurs during a process of sputtering or heating. The increase in area 25 due to thermal expansion of the pallet 8 is indicated by a hatching portion in an exaggerated manner. The actually produced pallet 8 made of A5052 has an outside diameter of 590 mm and thermal expansion determined by calculation from room temperature 20° C. to 300° C. (temperature rise of 280 degrees) is about 4 mm. At this point, the arm A27 and the arm B28 also thermally expand under the influence of heating, and the arm A27 thermally expands upward from a stationary portion in the lower part of the holder and the arm B28 thermally expands downward from the stationary portion at the upper tip end of the arm A27. Therefore, the thermal expansion is equivalent based on the ratio of linear thermal expansion coefficients and cancel each other so that the height of the engaging member 32 hardly changes.

Further, FIG. 8C shows a state where the carrier 1 moves between the vacuum chambers and a state of the carrier 1 during transportation after the process treatment being performed and thermally expanded. After the process treatment being completed, the arm opening/closing mechanism is released from the arm mechanism 26 to hold the pallet 8. Moreover, the pallet holding/driving mechanism 23 is detached from the pallet center holding mechanism 13 to release the center section of the pallet 8. While this state is a holding state of the pallet 8 similarly to the state in FIG. 8A, the arm mechanism 26 is an opening/closing mechanism and can shift in the in-plane direction by opening/closing to left or right and thus, the pallet 8 can be gripped by allowing for the increase in area 25 of the pallet outside diameter caused by thermal expansion. Both ends in the diameter direction of the pallet 8 are held by the engaging member 32 of the arm mechanism 26 while the center section of the pallet 8 is held by the pallet center holding mechanism 13 and the pallet holding/driving mechanism 23. Therefore, the pallet 8 is held in a vertical posture by clipping both ends in the diameter direction of the pallet 8 in the thickness direction without being affected by thermal expansion of the pallet 8 and the center position of the pallet center holding mechanism 13 maintains the position before thermal expansion in FIG. 8A.

According to a substrate processing apparatus and a substrate supporting apparatus in the second embodiment, as described above, the arm mechanism 26 has the engaging members 32 engaged with the pins 31 provided at both ends in the diameter direction of the pallet 8 from outside in the diameter direction and therefore, the pallet does not fall and no shifts in position occur during transportation. Moreover, the engaging member 32 is a mechanism engaged with the pin 31 from outside in the diameter direction and the arm mechanism 26 can open and close and therefore, if the pallet 8 thermally expands after being heated, the pallet double-end holding mechanism 26 can shift in the in-plane direction to an extent that allows for the increase 25 of the pallet outside diameter caused by thermal expansion. Further, during delivery between holding by the arm mechanism 26 and holding by the pallet center holding mechanism 13, the pallet 8 is held by both of the holding mechanisms 26 and 13.

In the second embodiment, similarly to the first embodiment, a change of the pallet center holding position due to changes of outside diameter dimensions of the pallet 8 caused by thermal expansion can be minimized, and there is no need to adjust each mechanism operation for each process condition. Further, an influence of dimension changes caused by thermal expansion of the pallet 8 on the arm mechanism 26 is minimized, and also the pallet 8 is fixed to the carrier 1 via the engaging member 32 of the arm mechanism 26 and thus, the pallet 8 is held with stability.

Further, since the arm mechanism 26 is an opening/closing mechanism, a conventional lift mechanism to move the pallet up and down becomes unnecessary. Therefore, in the second embodiment, similarly to the first embodiment, the production has a sequence of five operations, namely, holding the pallet center→releasing the pallet double-end holding mechanism→film formation process→holding the pallet→releasing pallet center holding so that the production tact can be shortened.

EXPLANATIONS OF LETTERS OR NUMERALS

1 Substrate supporting apparatus (carrier)
2 Vacuum chamber
3 Gate valve
8 Pallet
9 Apparatus body
11 Carrying magnet (Moving mechanism)
12 Substrate
13 Pallet center holding mechanism
15 holding member
23 Pallet holding/driving mechanism
24 Clip release mechanism
25 Increase in pallet area caused by thermal expansion
26 Pallet double-end holding mechanism (arm mechanism)
27 Arm A
28 Arm B
31 Pin (engaging part)
32 Engaging member

What is claimed is:
1. A substrate supporting apparatus, comprising:
a pallet configured and positioned to mount one or more substrates;
a pallet double-end holding mechanism that is provided in a supporting apparatus body and holds both ends of the pallet in a diameter direction while a substrate mounting surface of the pallet is in a vertical posture;
a pallet center holding mechanism that is arranged in a center section of the mounting surface of the pallet and rotatably holds the center section of the pallet; and
a moving mechanism that moves the supporting apparatus body, wherein the pallet double-end holding mechanism is a mechanism that grips both ends of the pallet in the diameter direction from both sides of a thickness direction thereof and the pallet double-end holding mechanism holds the pallet during movement of the apparatus body, during delivery between holding by the pallet double-end holding mechanism and the holding by the pallet center holding mechanism, the pallet is held by both of the holding mechanisms, and wherein during substrate processing, the center section of the pallet is rotatably held by the pallet center holding mechanism and the holding by the pallet double-end holding mechanism is released.

2. The substrate supporting apparatus according to claim 1, wherein the pallet center holding mechanism is connected to a driving mechanism that holds the pallet by moving to the center section of the pallet during substrate processing and withdraws from the center section of the pallet during movement of the apparatus body.

3. The substrate supporting apparatus according to claim 1, wherein the pallet double-end holding mechanism has a holding member detachable from both ends of the pallet in the diameter direction during substrate processing.

4. The substrate supporting apparatus according to claim 3, wherein the holding member is a clip mechanism capable of holding the pallet in the vertical posture by clipping both ends of the pallet in the diameter direction from both sides of the thickness direction and is provided on an extended line of a pallet horizontal direction central line.

5. The substrate supporting apparatus according to claim 4, wherein the clip mechanism is constructed from a component that generates a grip force by releasing an external force, holds the pallet when no external force is applied, and can release the holding of the pallet by applying an external force.

6. The substrate supporting apparatus according to claim 4, wherein, when the pallet thermally expands after being heated, the clip mechanism allows for an increase in area of the pallet caused by thermal expansion by shifting a gripping position of the pallet.

7. The substrate supporting apparatus according to claim 5, wherein the clip mechanism includes a release mechanism to cause a release of gripping by applying the external force thereto.

8. An inline-type substrate processing apparatus in which a plurality of vacuum chambers is hermetically connected along a transportation direction of a substrate and vacuum film formation processing is continuously performed on the substrate, comprising the substrate supporting apparatus according to claim 1, wherein a pallet on which the substrate is mounted is configured by the substrate supporting apparatus to move between the vacuum chambers in a vertical posture and a supporter to fix a concentric target that has a same rotation center as the pallet is arranged so as to face both sides of the pallet.

9. A substrate supporting method executed by using a substrate supporting apparatus, including:
a pallet configured and positioned to mount one or more substrates;
a pallet double-end holding mechanism that is provided in a supporting apparatus body and holds both ends of the pallet in a diameter direction while a substrate mounting surface of the pallet is in a vertical posture;
a pallet center holding mechanism that is arranged in a center section of the mounting surface of the pallet and rotatably holds the center section of the pallet; and
a moving mechanism that moves the supporting apparatus body, the substrate supporting method comprising:

a procedure for holding the pallet by gripping both ends of the pallet in the diameter direction from both sides of a thickness direction thereof by the pallet double-end holding mechanism during movement of the apparatus body;
a procedure for holding the pallet by both of the holding mechanisms during delivery between the holding by the pallet double-end holding mechanism and the holding by the pallet center holding mechanism; and
a procedure for rotatably holding the center section of the pallet by the pallet center holding mechanism and releasing the holding by the pallet double-end holding mechanism during substrate processing.

10. A computer readable recording medium recording a control program of a substrate supporting apparatus causing a controller of a substrate supporting apparatus, comprising:
a pallet configured and positioned to mount one or more substrates;
a pallet double-end holding mechanism that is provided in a supporting apparatus body and holds both ends of the pallet in a diameter direction while a substrate mounting surface of the pallet is in a vertical posture;
a pallet center holding mechanism that is arranged in a center section of the mounting surface of the pallet and rotatably holds the center section of the pallet; and
a moving mechanism that moves the supporting apparatus body, to execute:
a procedure for holding the pallet by gripping both ends of the pallet in the diameter direction from both sides of a thickness direction thereof by the pallet double-end holding mechanism during movement of the apparatus body;
a procedure for holding the pallet by both of the holding mechanisms during delivery between the holding by the pallet double-end holding mechanism and the holding by the pallet center holding mechanism; and
a procedure for rotatably holding the center section of the pallet by the pallet double-end holding mechanism and releasing the holding by the pallet double-end holding mechanism during substrate processing.

11. A substrate supporting apparatus, comprising:
a pallet configured and positioned to mount one or more substrates;
a pallet double-end holding mechanism that is provided in a supporting apparatus body and holds both ends of the pallet in a diameter direction while a substrate mounting surface of the pallet is in a vertical posture;
a pallet center holding mechanism that is arranged in a center section of the mounting surface of the pallet and rotatably holds the center section of the pallet; and
a moving mechanism that moves the supporting apparatus body,
wherein the pallet double-end holding mechanism is a mechanism that engages with an engaging part provided at both ends of the pallet in the diameter direction from outside in the diameter direction thereof and the pallet double-end holding mechanism holds the pallet during movement of the apparatus body, during delivery between the holding by the pallet double-end holding mechanism and the holding by the pallet center holding mechanism, the pallet is held by both of the holding mechanisms, and
wherein, during substrate processing, the pallet is rotatably held by the pallet center holding mechanism and the holding by the pallet double-end holding mechanism is released.

12. The substrate supporting apparatus according to claim 11, wherein the pallet center holding mechanism is connected to a driving mechanism that holds the pallet by moving to the center section of the pallet during substrate processing and withdraws from the center section of the pallet during movement of the apparatus body.

13. An inline-type substrate processing apparatus in which a plurality of vacuum chambers is hermetically connected along a transportation direction of a substrate and vacuum film formation processing is continuously performed on the substrate, comprising the substrate supporting apparatus according to claim 11, wherein a pallet on which the substrate is mounted is configured by the substrate supporting apparatus to move between the vacuum chambers in a vertical posture and a supporter to fix a concentric target that has a same rotation center as the pallet is arranged so as to face both sides of the pallet.

14. The substrate supporting apparatus according to claim 11, wherein the pallet double-end holding mechanism has an engaging member that withdraws from both ends of the pallet in the diameter direction during substrate processing and holds the pallet by moving to both ends of the pallet in the diameter direction during movement of the apparatus body.

15. The substrate supporting apparatus according to claim 14, wherein, when the pallet thermally expands after being heated, the engaging member allows for an increase in area of the pallet caused by thermal expansion by shifting an engagement position of the engaging part of the pallet.

16. The substrate supporting apparatus according to claim 14,
wherein the engaging part provided at both ends of the pallet in the diameter direction is a pin or a groove, and
wherein the engaging member is a portion of an arm mechanism provided at both ends of a pallet horizontal direction central line in an erect state in a vertical direction and the arm mechanism engages with the engaging part.

17. The substrate supporting apparatus according to claim 16, wherein the arm mechanism is compositely formed by combining two or more materials of different linear thermal expansion coefficients.

18. A substrate supporting method executed by using a substrate supporting apparatus, including:
a pallet configured and positioned to mount one or more substrates;
a pallet double-end holding mechanism that is provided in a supporting apparatus body and holds both ends of the pallet in a diameter direction while a substrate mounting surface of the pallet is in a vertical posture;
a pallet center holding mechanism that is arranged in a center section of the mounting surface of the pallet and rotatably holds the center section of the pallet; and
a moving mechanism that moves the supporting apparatus body, the substrate supporting method comprising:
a procedure for engaging with an engaging part provided at both ends of the pallet in the diameter direction from outside in the diameter direction thereof by the pallet double-end holding mechanism during movement of the apparatus body;
a procedure for holding the pallet by both of the holding mechanisms during delivery between the holding by the pallet double-end holding mechanism and the holding by the pallet center holding mechanism; and
a procedure for rotatably holding the pallet by the pallet center holding mechanism and releasing the holding by the pallet double-end holding mechanism during substrate processing.

19. A computer readable recording medium recording a control program of a substrate supporting apparatus causing a controller of a substrate supporting apparatus, comprising:
a pallet configured and positioned to mount one or more substrates;
a pallet double-end holding mechanism that is provided in a supporting apparatus body and holds both ends of the pallet in a diameter direction while a substrate mounting surface of the pallet is in a vertical posture;
a pallet center holding mechanism that is arranged in a center section of the mounting surface of the pallet and rotatably holds the center section of the pallet; and
a moving mechanism that moves the supporting apparatus body, to execute:
a procedure for engaging with an engaging part provided at both ends of the pallet in the diameter direction from outside in the diameter direction thereof by the pallet double-end holding mechanism during movement of the apparatus body;
a procedure for holding the pallet by both of the holding mechanisms during delivery between the holding by the pallet double-end holding mechanism and the holding by the pallet center holding mechanism; and
a procedure for rotatable holding the pallet by the pallet center holding mechanism and releasing the holding by the pallet double-end holding mechanism during substrate processing.

* * * * *